United States Patent [19]

Kakizaki et al.

[11] Patent Number: 5,515,086

[45] Date of Patent: May 7, 1996

[54] CONTACT STRUCTURE BETWEEN FLEXIBLE CABLE AND SIGNAL RECEIVING UNIT AND RECORDING APPARATUS USING SAID CONTACT STRUCTURE

[75] Inventors: Masaaki Kakizaki, Kawasaki; Akira Miyakawa, Yokohama, both of Japan

[73] Assignee: Canon Kabushiki Kaisha, Tokyo, Japan

[21] Appl. No.: 959,637

[22] Filed: Oct. 13, 1992

[30] Foreign Application Priority Data

Oct. 15, 1991 [JP] Japan ................................ 3-266233
Jun. 12, 1992 [JP] Japan ................................ 4-179480

[51] Int. Cl.⁶ .................................................. B41J 29/02
[52] U.S. Cl. .................................... 347/50; 439/66
[58] Field of Search ........................ 346/140 R; 439/66, 439/67; 347/50

[56] References Cited

U.S. PATENT DOCUMENTS

| | | | |
|---|---|---|---|
| 4,313,124 | 1/1982 | Hara | 346/140 R |
| 4,345,262 | 8/1982 | Shirato et al. | 346/140 R |
| 4,459,600 | 7/1984 | Sato et al. | 346/140 R |
| 4,463,359 | 7/1984 | Ayata et al. | 346/1.1 |
| 4,558,333 | 12/1985 | Sugitani et al. | 346/140 R |
| 4,706,097 | 11/1987 | Harmon | 346/139 C |
| 4,723,129 | 2/1988 | Endo et al. | 346/1.1 |
| 4,740,796 | 4/1988 | Endo et al. | 346/1.1 |
| 4,997,389 | 3/1991 | Doumani et al. | 439/493 |
| 5,059,129 | 10/1991 | Brodsky et al. | 439/67 |

FOREIGN PATENT DOCUMENTS

| | | | |
|---|---|---|---|
| 240710 | 10/1987 | European Pat. Off. | H01R 9/09 |
| 366885 | 5/1990 | European Pat. Off. | H01R 9/07 |
| 54-56847 | 5/1979 | Japan | B41M 5/26 |
| 59-123670 | 7/1984 | Japan | B41J 3/04 |
| 59-138461 | 8/1984 | Japan | B41J 3/04 |
| 60-71260 | 4/1985 | Japan | B41J 3/04 |

Primary Examiner—Benjamin R. Fuller
Assistant Examiner—Craig A. Hallacher
Attorney, Agent, or Firm—Fitzpatrick, Cella, Harper & Scinto

[57] ABSTRACT

A contact structure between a flexible cable for transmitting a signal from a control unit and a signal receiving unit for receiving the signal from said flexible cable characterized in that a plurality of projections are provided on a contact plane of said flexible cable, to which an elastic member having a plurality of protrusions formed at locations corresponding to respective projections in said flexible cable is attached, with the cross section of said protrusion being larger than that of corresponding projection, and the contact plane at a top end of each protrusion being flattened, whereby each projection is pressed against said signal receiving unit with a stress produced by elastic deformation of each protrusion.

10 Claims, 9 Drawing Sheets

CONTACT STRUCTURE BETWEEN FLEXIBLE CABLE AND SIGNAL RECEIVING UNIT AND RECORDING APPARATUS USING SAID CONTACT STRUCTURE

BACKGROUND OF THE INVENTION

1. Field of the Invention

The present invention relates to a contact structure between a flexible cable for transmitting a signal from a control unit and a signal receiving unit for receiving the signal through said flexible cable, and a recording apparatus such as a printer, a copying machine, and a facsimile apparatus for use as an output equipment for a composite machine or a work station including a computer or a word processor which uses said contact structure.

2. Related Background Art

In a variety of electronic equipments, flexible cables having a signal line formed on a flexible substrate are widely used as means for transmitting a signal from a control unit to a functional unit (e.g., a driving circuit) from the viewpoint of easy assembly. Also, as a mechanism for connecting the flexible cable to the functional unit, a contact structure has been widely used in which a contact plane of the flexible cable is contacted (pressed) with the signal receiving unit provided on the functional unit due to its elastic stress. Such a contact structure is favorable especially in removably attaching the functional unit to an apparatus main body.

Figure 8:
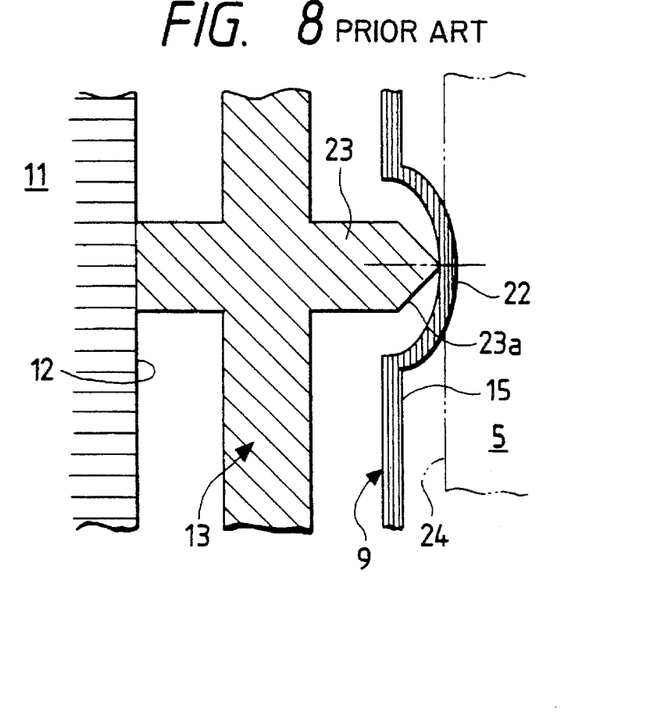
FIG. 8 is a partial cross-sectional view showing the state where the elastic member having a conical top end portion is contacted with the back side of the contact plane of FIG. 4.

On the other hand, there is described in U.S. Pat. No. 4,706,097 a contact structure between the flexible cable and the signal receiving unit for use with an ink jet recording apparatus in which the characteristic of volume change to a biasing force of an elastic member is substantially linear. According to a publication thereof, the flexible cable has a plurality of projections to be contacted with the signal receiving unit (contact plane) of a recording head on a contact plane thereof, which are arranged in a predetermined array, while the elastic member has a plurality of protrusions formed at locations corresponding to respective projections of the flexible cable on a face thereof opposed to the flexible cable. And each protrusion is columnar, with a top end portion contacted with the projection being conical. As shown in FIG. 8, each protrusion 23 has an apex of a conical portion 23a thereof located interiorly on the back side of corresponding projection 22 on the contact plane, whereby when a recording head is mounted so that each projection 22 of the flexible cable is contacted (pressed) with the signal receiving unit 24, each conical portion 23a of the elastic member 13 is elastically deformed to press each projection 22 against a contact point of the signal receiving unit 24 with a stress of elastic deformation, thereby assuring the signal transmission.

With the above constitution, the characteristic of volume change to the biasing force of elastic member is approximately linear, so that all the projections can be pressed with an excellent pressing force.

However, the above-described contact structure between the flexible cable and the signal receiving unit had the following drawbacks because contacting top end portion of the elastic member is conically shaped.

Figure 9:
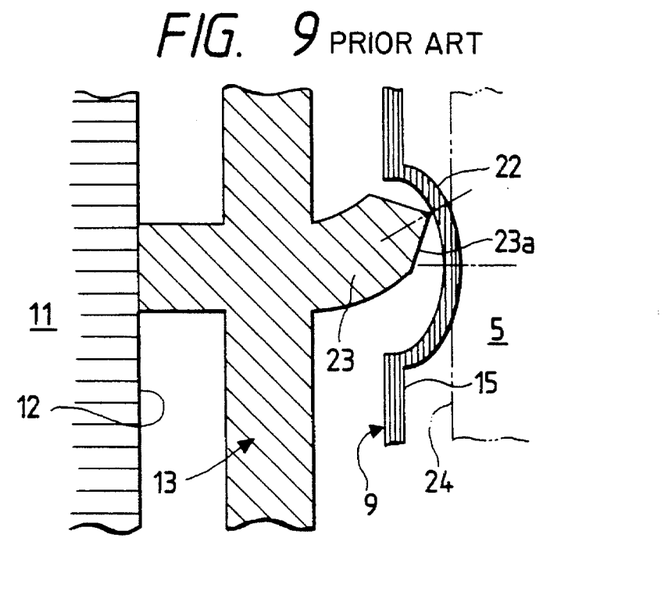
FIG. 9 is a partial cross-sectional view exemplifying the state where a protrusion clings interiorly to the back side of projection.

First, owing to a constitution in which the top end portion of each protrusion is contacted and pressed interiorly against the back side of each projection, when the apex position of each protrusion and that of each projection were not coincident by virtue of tolerances, a top end of the conical portion might cling to an inner face of the projection in assembling, as shown in FIG. 9, thereby making the conical portion buckled in assembling, so that the contact pressure between the contact plane and the signal receiving unit may not often reach a predetermined value. In particular, this problem will remarkably arise when the number of contact points increases.

Second, because the characteristic of volume change to the biasing force of the elastic member is not linear, numerical forecasting to attain a desired contact pressure is difficult in designing the elastic member, thereby taking some troubles in design.

SUMMARY OF THE INVENTION

In the light of the aforementioned technical problems, it is a main object of the present invention to provide a contact structure between a flexible cable and a signal receiving unit which is able to retain a desired contact pressure irrespective of assembling tolerances and cope with multiple contact points, and is easy to design. Other objects of the present invention will be apparent from the following description.

Typical examples of the present invention representing the features thereof are as follows. The present inventors have made a number of acute studies to accomplish the above-mentioned object, and come to a view that a desired contact pressure can be retained and the reliability in the electrical connection between the flexible cable and the signal receiving unit can be secured by adopting a constitution in which a top end portion of the protrusion is not contacted interiorly with the back side of the projection.

The present invention provides, based on the above-described view, a contact structure between a flexible cable for transmitting a signal from a control unit and a signal receiving unit for receiving the signal through the flexible cable characterized in that the flexible cable is provided with a plurality of projections on a contact plane of the flexible cable, to which an elastic member having a plurality of protrusions formed at locations corresponding to respective projections in the flexible cable is attached, with the cross section of the protrusion being larger than that of the projection, and the contact plane at a top end of each protrusion being flattened, whereby each projection is pressed against the signal receiving unit with a stress produced by elastic deformation of each protrusion. With the above constitution, when each projection of the flexible cable is contacted (pressed) with the signal receiving unit, the elastic member will deform elastically to press each projection against each contact point of the signal receiving unit with a stress substantially proportional to its variation (amount of compression), so that a proper contact pressure is secured and a stable signal transmission is assured.

Furthermore, the present invention is of course effective as a single constitution as above described, but it is possible to provide a high reliability in the recording apparatus with the above constitution.

DESCRIPTION OF THE PREFERRED EMBODIMENTS

Figure 1:
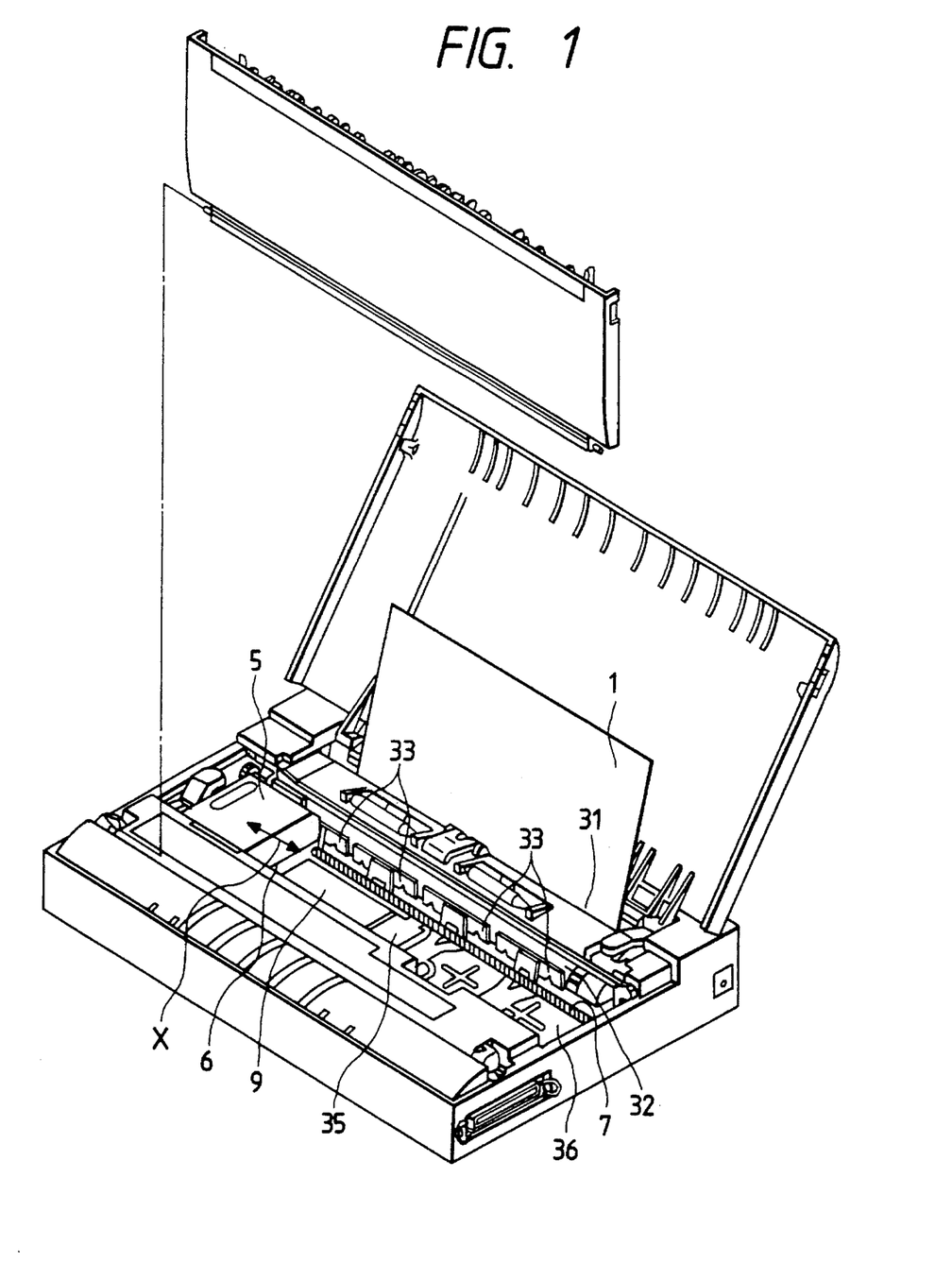
FIG. 1 is a perspective view schematically showing a constitution of a recording apparatus according to one embodiment of the present invention.

An embodiment of the present invention will be described below with reference to FIGS. 1 to 7. FIG. 1 is a schematic perspective view showing a recording apparatus having a contact structure between a flexible cable and a signal receiving unit according to one embodiment of the present invention. This embodiment is an ink jet recording apparatus in which the recording is made by discharging the ink from the recording head onto a recording sheet. In FIG. 1, this recording apparatus is configured to convey (feed) a recording sheet 1 with conveying means, and record onto the recording sheet 1 with recording head (recording means) 5. The conveying means for the recording sheet 1 is configured to insert a recording sheet such as a plain paper or plastic thin plate through an insertion opening 31, rotate a conveying roller 32 by driving a motor not shown, and convey the recording sheet 1 back to the recording position while guiding it along a paper presser plate 33.

The recording apparatus of the present invention is a serial recording type, in which the recording head 5 is mounted on a carriage 6, which is engaged in a lead groove of a lead screw 7 rotatably driven by the motor not shown. Therefore, the carriage 6 can move reciprocatingly in directions of double arrow X by rotating the lead screw 7. And the recording is performed by driving the recording head 5 based on an image signal in synchronism with the reciprocatory movement of the carriage 6, and discharging the ink through discharge ports of the recording head 5 onto the recording sheet 1. The recording head 5 used in this embodiment may be an exchangeable cartridge type having an ink tank integral therewith.

Figure 7:
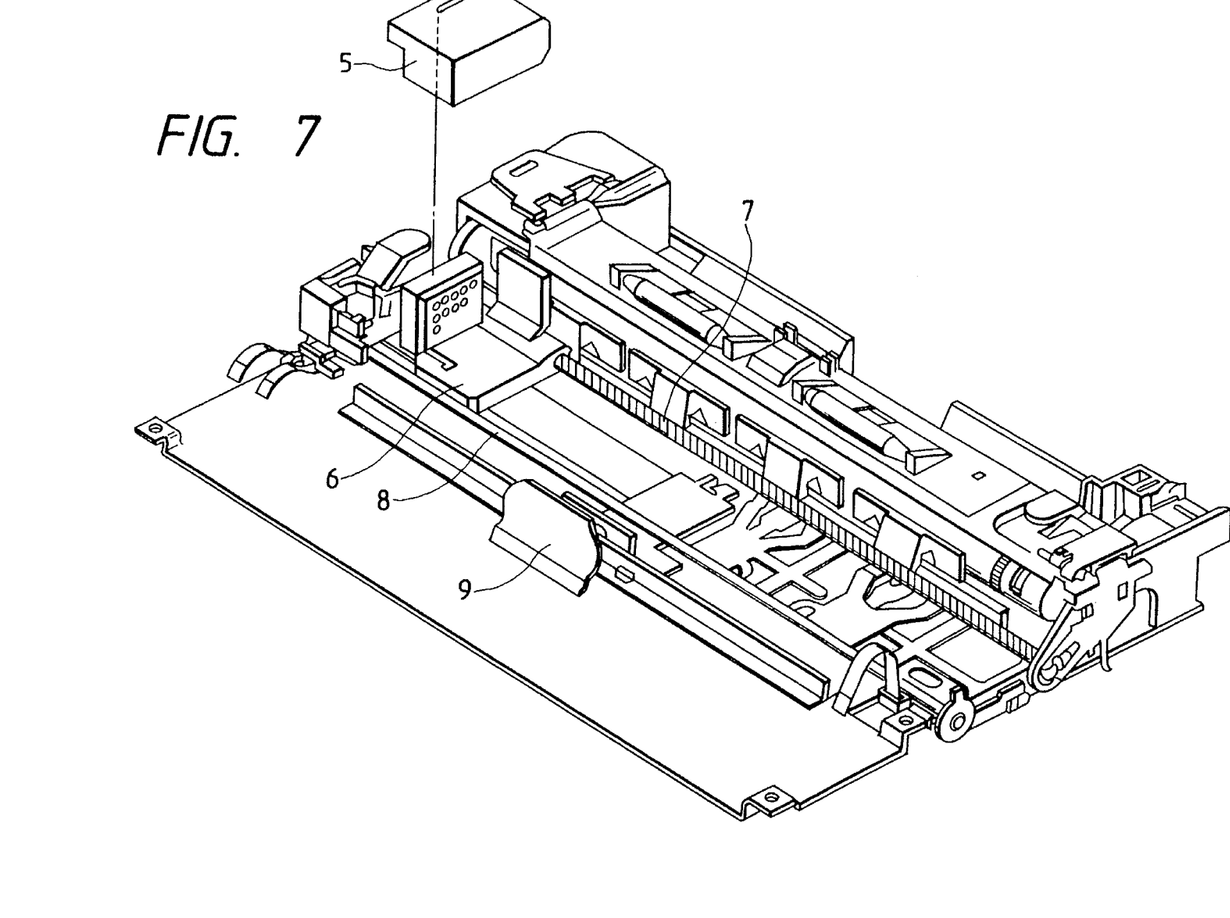
FIG. 7 is a partial perspective view showing how to attach or detach a recording head to or from the recording apparatus of FIG. 1.

FIG. 7 shows how to attach or detach a recording head of cartridge type to or from the recording apparatus.

A control unit (e.g., a control circuit) provided on the side of an apparatus main body and the recording head 5 are connected electrically (capable of transmitting the signal) via a flexible cable 9. This flexible cable 9 is secured to a chassis 36 of the apparatus main body by a presser member (presser plate) 35 at an end portion of the control unit so as to follow the reciprocatory movement of the carriage 6 without impeding the movement.

The recording head 5 is an ink jet recording head which discharges the ink by the use of the heat energy, and comprises electricity-heat converters for generating the heat energy. Also, the recording head 5 discharges the ink through discharge ports in recording by using the pressure change occurring due to growth and shrinkage of bubbles produced by film boiling caused by the heat energy to be applied by the electricity-heat converters.

Figure 2:
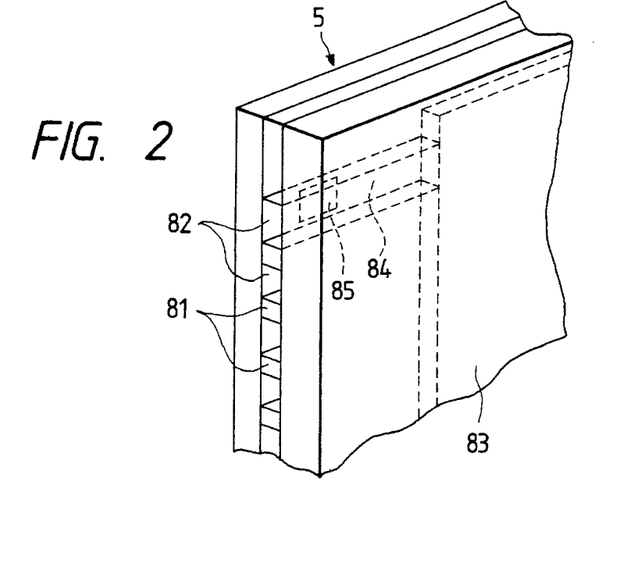
FIG. 2 is a partial perspective view schematically showing a structure of an ink discharge portion in recording means as shown in FIG. 1.

FIG. 2 is a partial perspective view schematically showing the construction of an ink discharge portion in the recording means 5. In FIG. 2, a plurality of discharge ports 82 are formed at a predetermined pitch on a discharge port formation face 81 spaced a predetermined clearance (e.g., about 0.5 to 2.0 millimeter) from recording medium 1, and electricity-heat converters 85 (e.g., heat generating resistors) for generating the energy for the discharge of the ink are each disposed along a wall face of each liquid channel 84 communicating a common liquid chamber 83 to each discharge port 82. In this embodiment, the recording head 5 is mounted on the carriage 6 in a positional relation in which the discharge ports 82 are arranged in a direction crosswise to a main scan direction (movement direction) of the carriage 6. Thus, recording means (recording head) 5 is constituted in which based on an image signal or discharge signal, corresponding electricity-heat converters 85 are driven (energized), film boiling the ink within the liquid channels 84, and discharging the ink through the discharge ports 82 with a pressure produced at that time.

In FIG. 1, a signal (e.g., an image signal) from a control unit (not shown) of the apparatus main body to the recording head 5 is passed through the flexible cable 9, and the electrical connection between this recording head 5 and the flexible cable 9 is achieved by contacting a contact plane (contact point face) provided on the flexible cable 9 against a signal receiving unit (contact point face) provided on the recording head 5 with a predetermined contact pressure.

Figure 3:
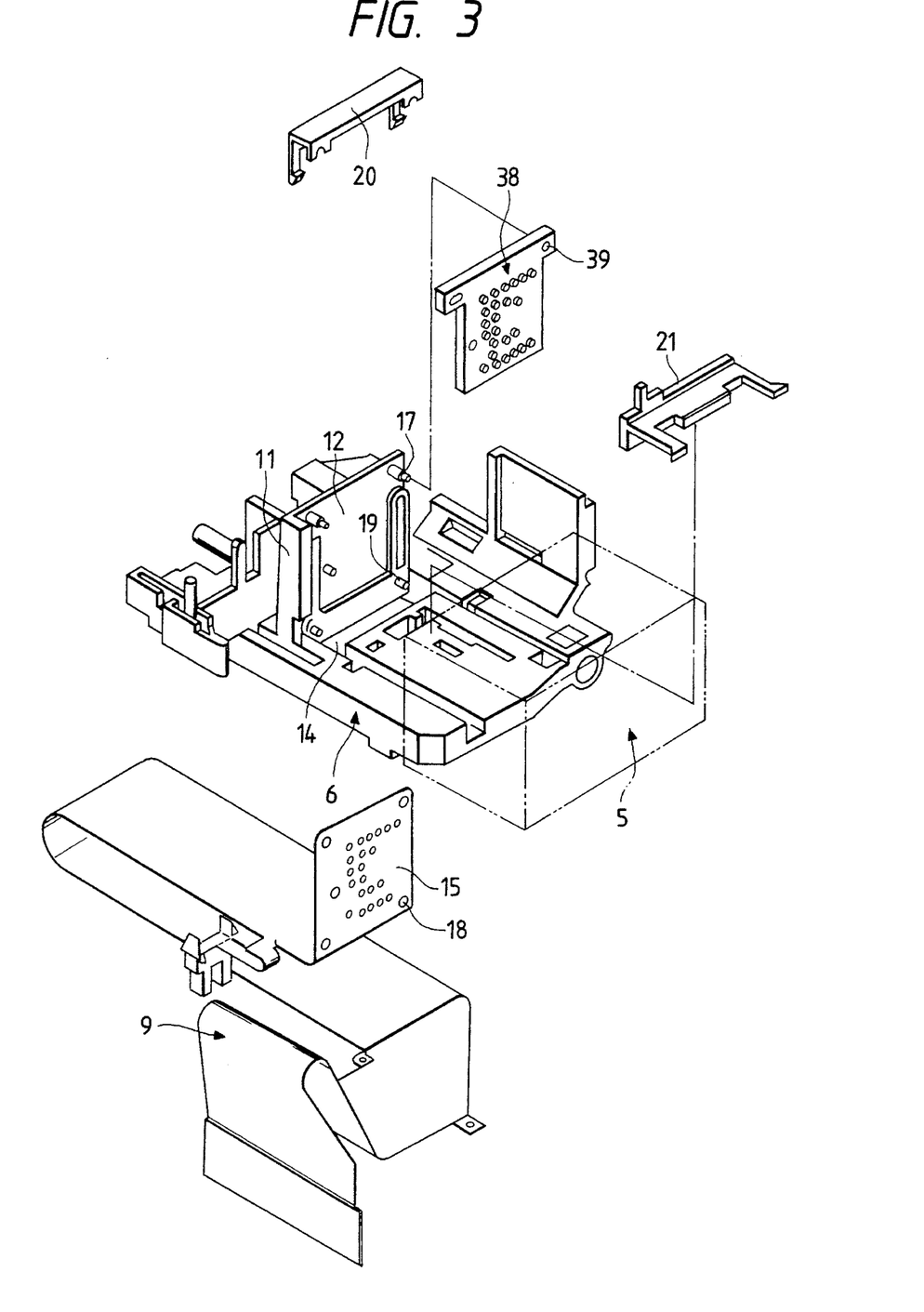
FIG. 3 is a partial perspective view schematically showing a contact structure between a flexible cable and a recording head to which the present invention is applied.

FIG. 3 is a schematic exploded perspective view showing a contact structure between the flexible cable 9 on the carriage 6 and the recording head 5 according to one embodiment. In FIG. 3, the carriage 6 is integrally formed with a vertical wall contact portion 11, which acts to sustain a contact pressure between the recording head 5 and the flexible cable 9. Note that the recording head 5 is positioned and attached exchangeably at a position spaced by a fixed distance away from the contact portion 11.

In FIG. 3, a rubber pad 38 acting as an elastic member, is positioned and fixed therein along a vertical face 12 of the contact portion 11 on the carriage 6, and then a connecting portion (top end portion) of the flexible cable 9 is drawn out through a flexible cable creeping hole 14 to position a contact plane (contact point face) 15 thereof on the carriage. The positioning and fixing of the rubber pad 38 are performed by fitting a reference hole 39 of the rubber pad around a reference axis 17 of the contact portion 11, while the positioning of the contact plane 15 for the flexible cable 9 is performed by fitting a reference hole 18 of the contact plane around a reference axis 19 of the contact portion 11. The flexible cable 9 thus positioned can be secured to the carriage 6 by using a flexible cable presser upper-half 20 and a flexible cable presser lower-half 21. The recording head 5 is positioned and fixed removably to the carriage 6 in the state where the signal receiving unit (not shown) is pressed against the rubber pad 38.

Figure 4:
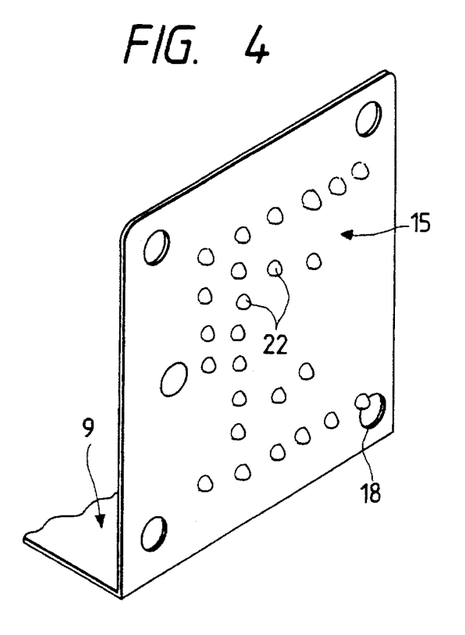
FIG. 4 is a partial perspective view showing a contact plane of the flexible cable as shown in FIG. 3.
Figure 5:
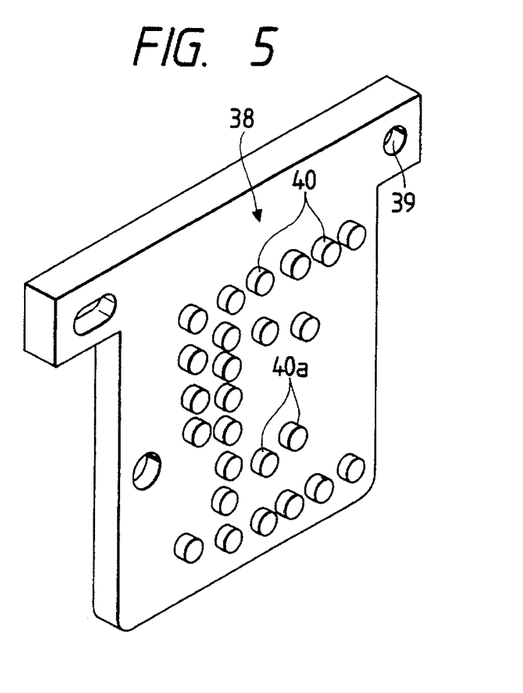
FIG. 5 is a perspective view of an elastic member as shown in FIG. 3.
Figure 10:
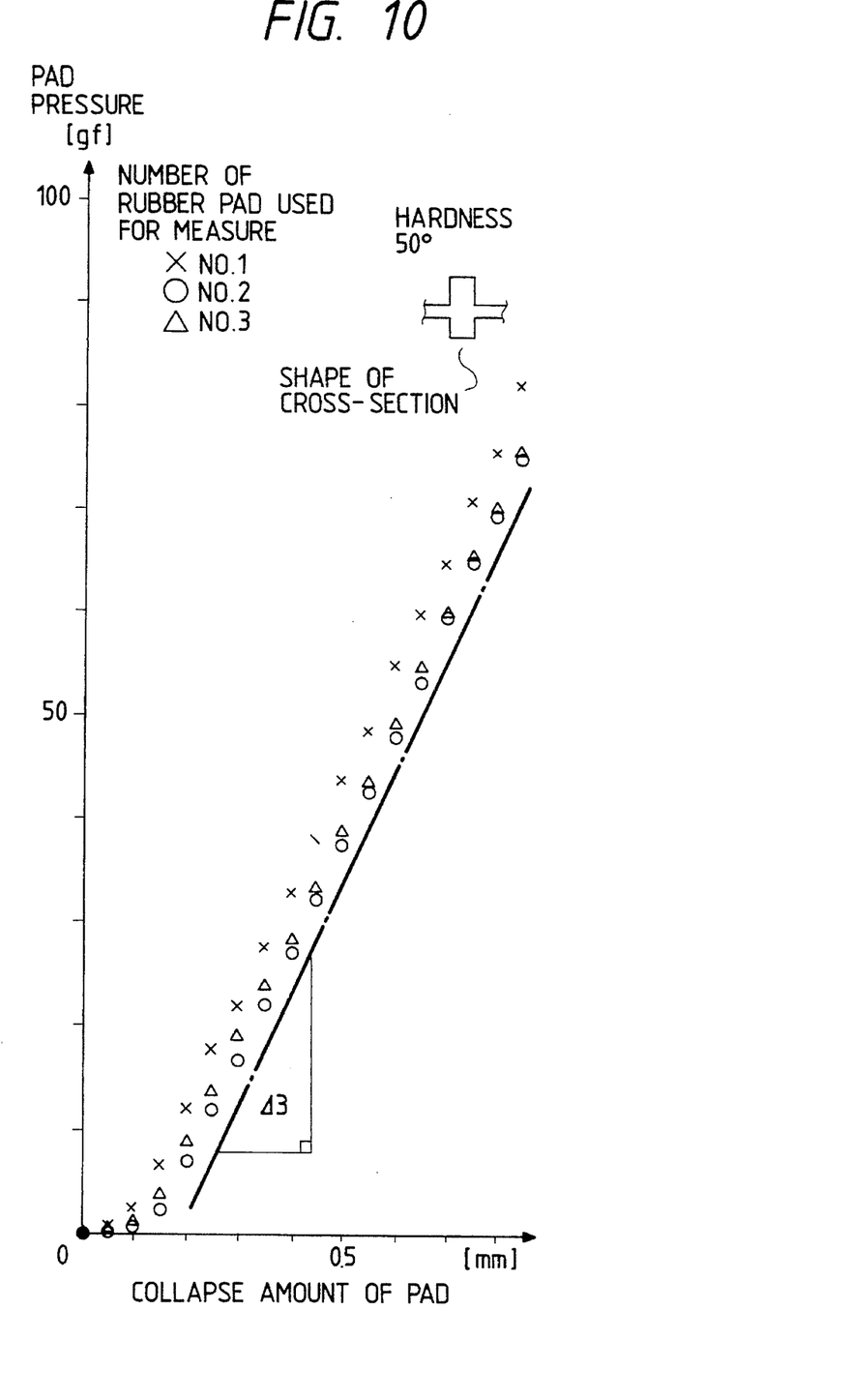
FIG. 10 is a view showing the relation between the amount of deformation in an elastic member according to the present invention and the contact pressure.

FIG. 4 is a partial perspective view showing a contact plane 15 of the flexible cable 9, on which are formed a plurality of projections 22 to be pressed against the signal receiving unit (contact plane) of the recording head 5 in a predetermined array, as in FIG. 10. FIG. 5 is a perspective view of the rubber pad (elastic member) 38. In FIG. 5, a plurality of protrusions 40 are formed on a face of the rubber pad 38 opposed to the flexible cable 9 in the same array as that of the projections 22 on the contact plane 15 of the flexible cable (at positions corresponding to respective projections 22). Each protrusion 40 is of a columnar shape having a substantially same cross section along a height direction thereof, and cylindrical in the figure as shown.

Figure 6:
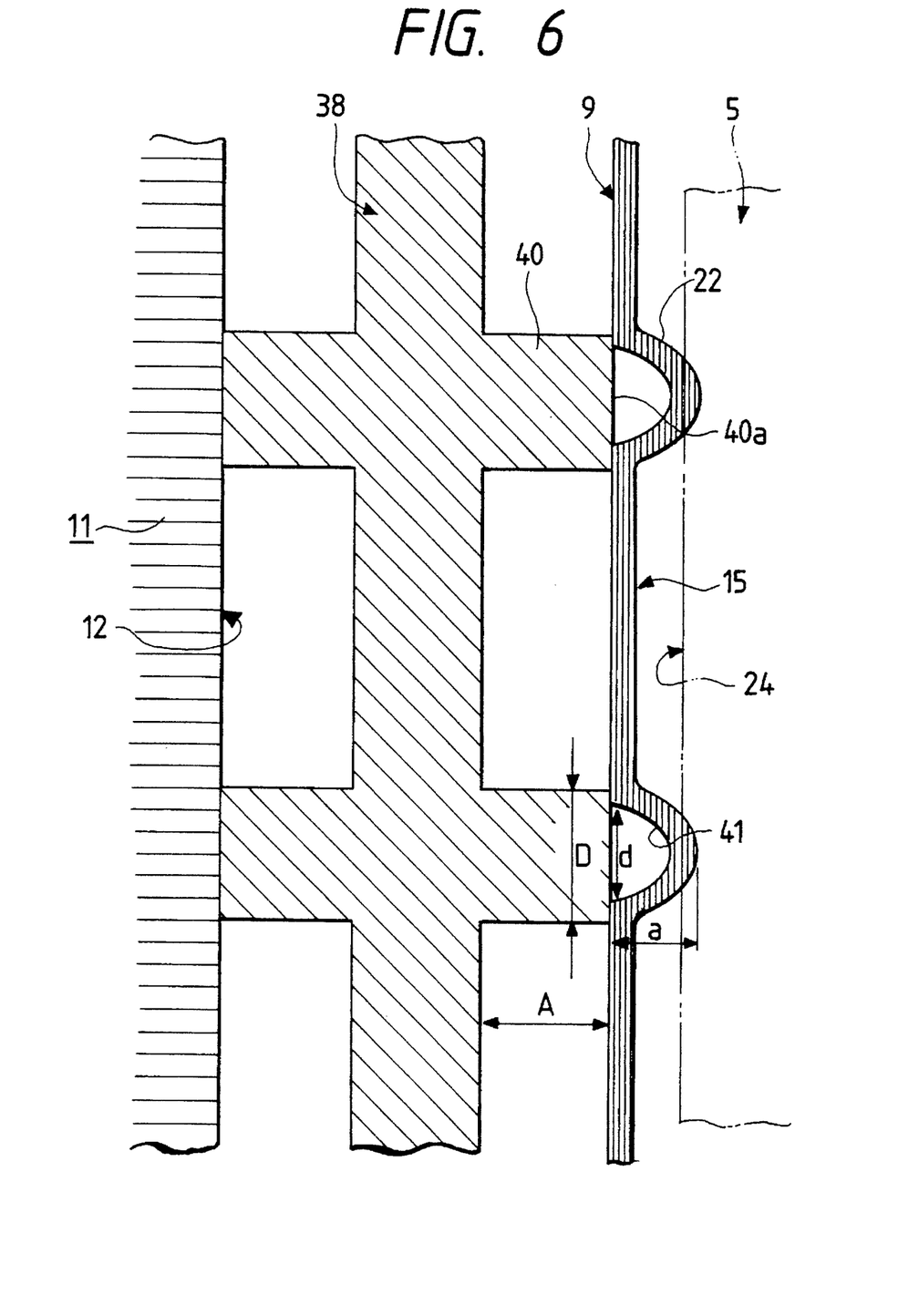
FIG. 6 is a partial cross-sectional view showing the state where the elastic member of FIG. 5 is contacted with the back side of the contact plane of FIG. 4.

FIG. 6 is a partial cross-sectional view showing the positional relation between each protrusion and each projection. In FIGS. 4 to 6, a top end face 40a of the each protrusion 40 is formed as a flat face parallel to the contact plane 15, with the area of the top end face 40a being larger than the cross section of each corresponding projection 22 of the flexible cable 9. That is, as shown in FIG. 6, the top end face 40a of the protrusion 40 is set so as not to enter a recess portion 41 on the back side of the projection 22, and to be contacted with the periphery therearound. And the area of the top end face 40a is selected at such a value that even if there occurs a dislocation between a center of each projection 22 and a center of each protrusion due to tolerances on the assembly and manufacture, the top end face 40a can be contacted with the periphery around the cross section of the projection 22 by absorbing the dislocation as shown in FIG. 6.

Herein, the elastic member in this embodiment will be specifically described in connection with FIG. 6. It is assumed in this embodiment that the diameter D of top end portion in cross section is 1 mm, a depression on the back side of projection is circular, the diameter d in cross section having the largest area is 0.65 mm, the length A of protrusion is 1 mm, and the height a of projection including the thickness of flexible cable is 0.22 mm. The cross section of the top end portion is preferably two or more times the largest area of the depression on the back side of projection, in view of absorbing the tolerances. With such a setting, a proper contact pressure can be assured therebetween even if any dislocation occurs between a center of each projection and a center of each protrusion. The diameter d of the depression on the back side of projection in cross section having the largest area is preferably three or less times the height A of projection including the thickness of the flexible cable. By designing the projection in this way, it is possible to relieve a fear that the projection may collapse even if it is not pressed by the protrusion abutting against the depression on the back side of projection. The present inventors attempted the test of contact with the recording head ninety times, providing that the diameter of depression on the back side of projection in cross section having the largest area was 0.5 mm and the height of projection including the thickness of flexible cable was 0.22 mm, and obtained an excellent result that the height of projection after the test was reduced by 7 μm in average.

Figure 11:
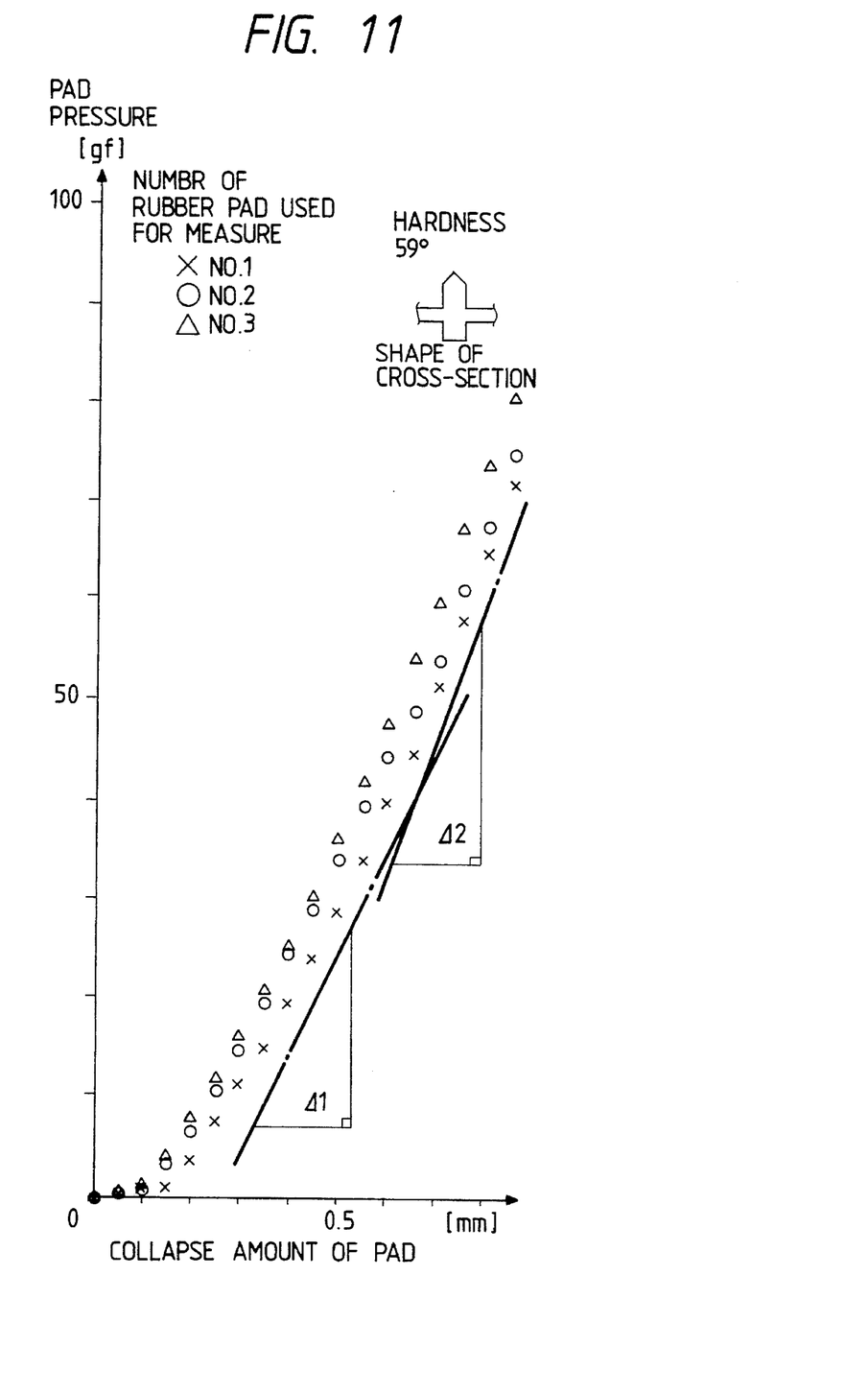
FIG. 11 is a view showing the relation between the amount of deformation in an elastic member having a conventional shape and the contact pressure.

Next, the relation between the amount of deformation in the elastic member and the contact pressure in this embodiment is practically shown in FIG. 10. The same figure shows the measurements of using three elastic members having a rubber hardness of 50 degrees, and a comparative example is shown in FIG. 11 with the measurements performed in the same way by using elastic members each including a conical top end portion and having a rubber hardness of 59 degrees. The "rubber hardness" in this embodiment is pursuant to a spring hardness test type A of Japanese Industrial Standard. The reason of changing the rubber hardness depending on the shape of top end portion is to make clear the difference in the inclination so that the contact pressure when the elastic member is collapsed to the largest extent is substantially the same. The largest amount of collapse in the elastic member at this time is set at 0.67±0.141 mm, and the tolerance is suitably about ±0.2 mm.

As will be clear from these figures, in a conical-shaped elastic member, the slope of graph is not linear as seen from Δ1 and Δ2, while in an elastic member having a planar top end portion, it is substantially linear as seen from Δ3. That is, it can be said that the elastic member having a planar top end portion has the linearity.

Figure 12:
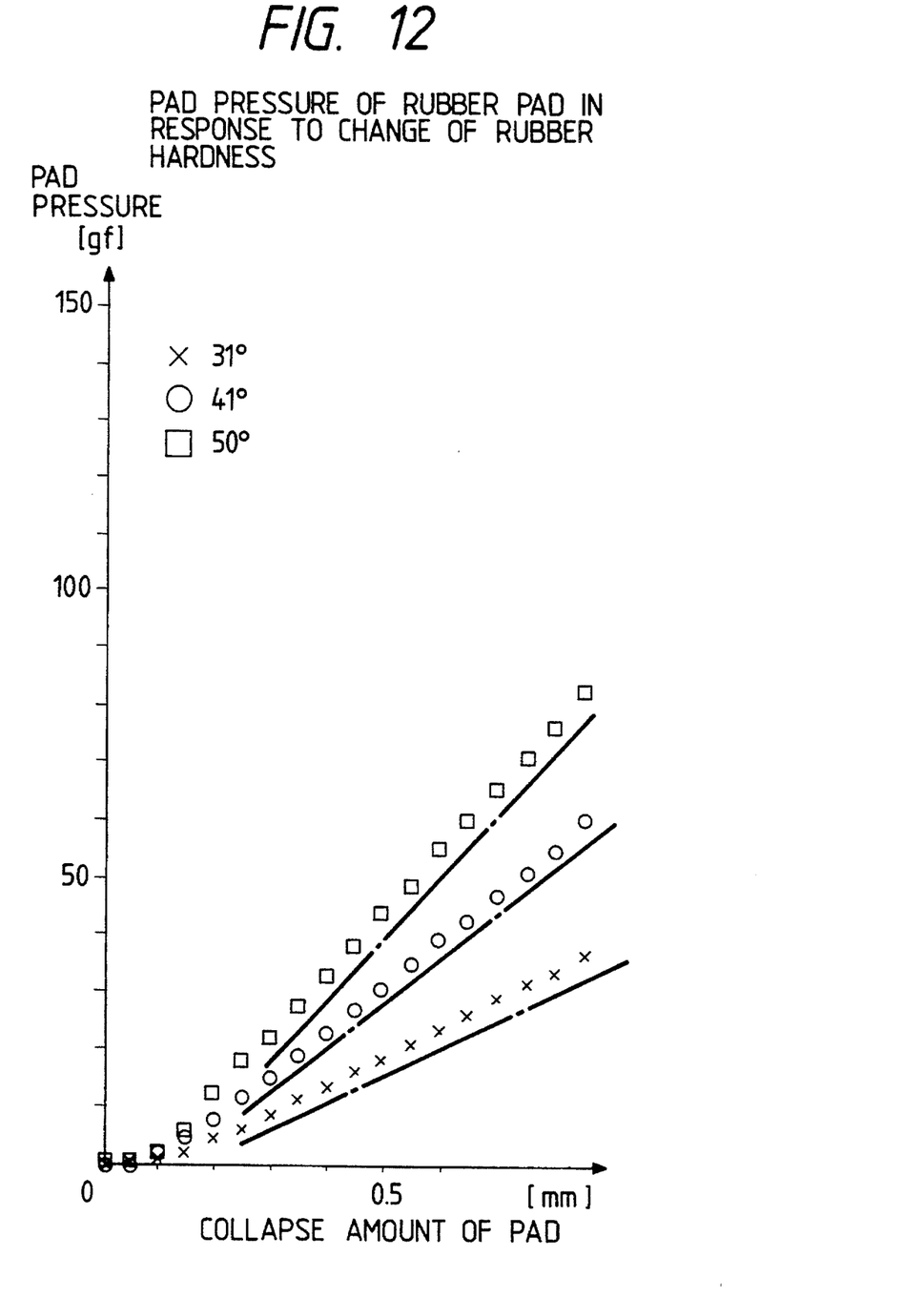
FIG. 12 is a view showing the relation between the amount of deformation in an elastic member produced by the difference of hardness and the contact pressure.

Thereby, for the elastic member having a planar top end portion, the relation between the amount of deformation and the contact pressure can be set arbitrarily to a certain extent by changing the rubber hardness in the material. For example, the relation between the amount of deformation and the contact pressure is shown in FIG. 12, when the rubber hardness for the elastic member having a planar top end portion is changed to 31°, 41° and 50°. From this figure, it can be seen that the slope changes substantially in proportion to the rubber hardness, or in other words, it is possible to make an appropriate design by changing the rubber hardness to obtain a desired contact pressure.

While in this embodiment, chloroprene rubber having a rubber hardness of 41° is used, it should be noted that the rubber hardness is preferably in a range from 20° to 60° to prevent the buckle of elastic member itself or the damage of projection.

Furthermore, while in this embodiment the top end portion is planar, it will be appreciated that a convex portion may be provided at the center of the top end portion unless it makes contact with the depression on the back side of projection. With such a convex portion, it is possible to securely contact each protrusion against each projection even when there are many contact points.

While in the above-described embodiment, the present invention is applied to an ink jet recording apparatus, the present invention is also applicable to a variety of recording apparatuses such as a wire dot recording apparatus, a laser beam recording apparatus, a thermal transfer recording apparatus, or a thermal recording apparatus, without regard to recording method with recording means (recording head). Further, the present invention is also applicable to a recording apparatus for use in a facsimile apparatus or copying machine having integrally an image input portion (image reading portion), a composite machine including a computer or word processor, and an output device for a work station, whereby the same effects can be accomplished. Further, while in the above-described embodiment a serial type recording apparatus comprising recording means (recording head) making the scanning along the recording sheet was exemplified, the present invention is also applicable to a line type recording apparatus using line type recording means corresponding to the whole or a part of the recording width for the recording sheet with the same effects.

Further, while in the above-described embodiment a recording apparatus using a single recording head was described, the present invention is also applicable to a variety of recording apparatuses such as a color recording apparatus using a plurality of recording means for recording with different colors, or a recording apparatus for the gradation recording using a plurality of recording means for recording at different densities of the same color, whereby the same effects can be accomplished. Further, the present invention is also applicable to recording means having any constitution between recording head and ink tank, such as a cartridge type having an ink tank integrally formed, and a type having a recording head and an ink tank separately provided and connected via an ink supply tube, whereby the same effects can be accomplished.

When the present invention is applied to an ink jet recording apparatus, it can be applied to those using recording means (recording head) with electricity-heat converters such as piezoelectric elements, among which an ink jet recording apparatus using recording means relying on the method of discharging the ink by the use of the heat energy can achieve the excellent effects. With such a method, the higher density and definition of recording can be accomplished.

It is preferable to employ the typical structure and the principle of structures disclosed in, for example, U.S. Pat. Nos. 4,723,129 and 4,740,796. This system can be adopted in a so-called "On-Demand" type and "Continuous" type structures. In particular, the "On-Demand" type is more preferable, because an electrothermal conversion member disposed to align to a sheet or a liquid passage in which liquid (ink) is held is supplied with at least one drive signal which corresponds to information to be recorded and which enables the temperature of the electrothermal conversion member to be raised higher than a nuclear boiling point, so that thermal energy is generated in the electrothermal conversion member and film boiling is caused to take place on the surface of the recording head which is heated. As a result, bubbles can be respectively formed in liquid (ink) in response to the drive signals.

Due to the enlargement and contraction of the bubble, liquid (ink) is discharged through the discharge port, so that at least one droplet is formed. In a case where the aforesaid drive signal is made to be a pulse signal, a further satisfactory effect can be obtained in that the bubble can immediately and properly be enlarge/contracted and liquid (ink) can be discharged while exhibiting excellent responsibility. It is preferable to employ a drive signal of the pulse signal type disclosed in U.S. Pat. Nos. 4,463,359 and 4,345,262. Furthermore, in a case where conditions for determining the temperature rise ratio on the aforesaid heated surface disclosed in U.S. Pat. No. 4,313,124 are adopted, a further excellent recording operation can be performed.

In addition to the structure (a linear liquid passage or a perpendicular liquid passage) of the recording head formed by combining the discharge ports, the liquid passage and the electro-thermal conversion member as disclosed in the aforesaid specifications, a structure disclosed in U.S. Pat. Nos. 4,558,333 and 4,459,600 in which the heated portion is disposed in a bent portion is included in the scope of the present invention. Furthermore, the present invention can effectively be embodied in a structure in which a common slit is made to be the discharge portion of a plurality of electrothermal conversion members and which is disclosed in Japanese Patent Laid-Open No. 59-123670 and a structure in which an opening for absorbing thermal energy pressure wave is formed to align to the discharge port and which is disclosed in Japanese Patent Laid-Open No. 59-138461. That is, the present invention can ensure an efficient recording in whatever form the recording head may be.

A full line type recording head having a length which corresponds to the width of the maximum recording medium which can be recorded by the recording apparatus may be a structure capable of realizing the aforesaid length and formed by combining a plurality of recording heads as disclosed in the aforesaid specifications or a structure formed by an integrally formed recording head. The present invention will enable the aforesaid effects to be exhibited further effectively. In addition, the present invention can also be effectively adapted to a structure having an interchangeable chip type recording head which can be electrically connected to the body of the apparatus or to which ink can be supplied from the body of the apparatus when it is mounted on the body of the apparatus or a cartridge type recording head integrally formed to the recording head.

Also, addition of a restoration means for the recording means, a preliminary auxiliary means, etc. provided as the constitution of the recording device is preferable because the effects of the present invention can be further stabilized. Specific examples of these may include, for the recording head, capping means, cleaning means, pressurization or suction means, electricity-heat converters or another type of heating elements, or preliminary heating means according to a combination of these, and it is also effective for performing stable recording to perform preliminary mode which performs discharging separate from recording.

Further, as the type of the recording head to be mounted and the number of heads, the present invention is effective to either a single recording head provided corresponding to a monochrome ink or a plurality of recording heads provided corresponding to a plurality of inks having different recording colors or densities. That is, as the recording mode of the ink jet recording device, the present invention is extremely effective for not only the recording head only of a primary color such as black, etc., but also a device equipped with at least one of plural different colors or full color by color mixing, whether the recording head may be either integrally constituted or combined in plural number.

Though the ink is considered as the liquid in the embodiments of the present invention as above described, the present invention is applicable to either of the ink solid below room temperature, and softening or liquefying at or above room temperature, and the ink liquefying when a recording enable signal is issued as it is common with the ink jet recording device to control the viscosity of ink to be maintained within a certain range of the stable discharge by adjusting the temperature of ink in a range from 30° C. to 70° C. In addition, in order to avoid the temperature elevation due to the heat energy by positively utilizing the heat energy for the change of state from solid to liquid, or to prevent the ink from evaporating by the use of the ink stiffening in the shelf state, the ink having a property of liquefying only with the application of heat energy, such as the ink liquefying with the application of heat energy in accordance with a recording signal so that liquid ink is discharged, or the ink already solidifying upon reaching a recording medium, is also applicable in the present invention.

In this case, the ink may be in the form of being held in recesses or through holes of porous sheet as liquid or solid matter, and opposed to electricity-heat converters, as described in Japanese Laid-Open Patent Application No. 54-56847 or Japanese Laid-Open Patent Application No. 60-71260. The most effective method for inks as above described in the present invention is based on the film boiling.

In addition, the ink jet recording apparatus according to the present invention may be used in the form of an image output terminal of the information processing equipment such as a computer, a copying machine in combination with a reader, or a facsimile apparatus having the transmission and reception feature.

What is claimed is:

1. A recording apparatus, comprising:

recording means for recording on a recording medium; and control means for controlling a signal for driving said recording means, said recording means being electrically connected through a flexible cable to said control means, wherein said flexible cable has a plurality of electrode pads, each of said pads corresponding to a signal receiving portion of said recording means, said recording means being connected to said flexible cable, and recess portions, provided on the plurality of electrode pads, and dimpled in a direction of said signal receiving portion, and wherein said flexible cable is pressed by an elastic member, for pressing an outer periphery of each the recess portions with a plane in the direction of said signal receiving portion, so as to electrically connect said flexible cable with said recording means, and wherein a cross sectional area of a portion of the elastic member contacting the recess portion is more than two times larger than an area of a hole defined by the recess portion on a surface of the flexible cable.

2. A recording apparatus according to claim 1, wherein said recording apparatus is an ink jet recording means.

3. A recording apparatus according to claim 2, wherein said recording means is an ink jet recording means having electricity-heat converters for generating heat energy for use in discharging ink.

4. A recording apparatus according to claim 3, wherein said recording means discharges ink through discharge ports by use of film boiling caused in the ink due to the heat energy generated by said electricity-heat converters.

5. A recording apparatus according to claim 1, wherein the elastic member is formed of a rubber.

6. A recording apparatus, comprising:

recording means for recording on a recording medium; and control means for controlling a signal for driving said recording means, said recording means being electrically connected through a flexible cable to said control means, wherein said flexible cable has a plurality of electrode pads, each of said pads corresponding to a signal receiving portion of said recording means, said recording means being connected to said flexible cable, and recess portions, provided on the plurality of electrode pads, and dimpled in a direction of said signal receiving portion, and wherein said flexible cable is pressed by an elastic member, for pressing an outer periphery of each the recess portions with a plane in the direction of said signal receiving portion, so as to electrically connect said flexible cable with said recording means, and wherein a diameter of a hole defined by the recess portion on a surface of the flexible cable is more than three times less than a sum of a thickness of the flexible cable and a depth of the recess portion.

7. A recording apparatus according to claim 6, wherein said recording apparatus is an ink jet recording means.

8. A recording apparatus according to claim 7, wherein said recording means is an ink jet recording means having electricity-heat converters for generating heat energy for use in discharging ink.

9. A recording apparatus according to claim 8, wherein said recording means discharges ink through discharge ports by use of film boiling caused in the ink due to the heat energy generated by said electricity-heat converters.

10. A recording apparatus according to claim 6, wherein the elastic member is formed of a rubber.

* * * * *

UNITED STATES PATENT AND TRADEMARK OFFICE
CERTIFICATE OF CORRECTION

PATENT NO. : 5,515,086

DATED : May 7, 1996

INVENTOR(S): MASAAKI KAKIZAKI ET AL.    Page 1 of 2

It is certified that error appears in the above-identified patent and that said Letters Patent is hereby corrected as shown below:

Drawings:

SHEET 8

"NUMBR" should read --NUMBER--.

COLUMN 4

Line 20, "a" should read --at--.

COLUMN 5

Line 50, "height A" should read --height a--.

COLUMN 7

Line 40, "enlarge/contracted" should read --enlarged/contracted--.

COLUMN 9

Line 21, "each" should read --each of--; and

Line 26, "cross sectional" should read --cross-sectional--.

UNITED STATES PATENT AND TRADEMARK OFFICE
CERTIFICATE OF CORRECTION

PATENT NO. : 5,515,086

DATED : May 7, 1996

INVENTOR(S) : MASAAKI KAKIZAKI ET AL.    Page 2 of 2

It is certified that error appears in the above-identified patent and that said Letters Patent is hereby corrected as shown below:

COLUMN 10

Line 18, "each" should read --each of--.

Signed and Sealed this

Twenty-second Day of October, 1996

Attest:

BRUCE LEHMAN

*Attesting Officer*    *Commissioner of Patents and Trademarks*